United States Patent
Wu et al.

(10) Patent No.: US 7,018,747 B2
(45) Date of Patent: Mar. 28, 2006

(54) PHOTOMASK HAVING LINE END PHASE ANCHORS

(75) Inventors: Wei E. Wu, Austin, TX (US); Bernard J. Roman, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 146 days.

(21) Appl. No.: 10/261,905

(22) Filed: Oct. 1, 2002

(65) Prior Publication Data

US 2004/0063002 A1    Apr. 1, 2004

(51) Int. Cl.
 *G03F 9/00* (2006.01)
(52) U.S. Cl. .................. 430/5; 430/313; 430/314; 430/316; 430/323; 430/324; 216/12
(58) Field of Classification Search ............... 430/5, 430/323, 324, 322, 313, 314; 216/12
See application file for complete search history.

(56) References Cited

U.S. PATENT DOCUMENTS 5,300,379 A * 4/1994 Dao et al. .................. 430/5
5,718,829 A * 2/1998 Pierrat ...................... 216/12

* cited by examiner

*Primary Examiner*—Christopher G. Young
(74) *Attorney, Agent, or Firm*—Joseph P. Lally

(57) ABSTRACT

A photomask and a method for making the same in which an opaque feature (38) is formed on a transparent substrate (32) and a depression (44) is etched in the transparent substrate (32) adjacent to the opaque feature (38). The depression (44) is etched to a depth such that a phase difference between light passing through the substrate (32) outside the depression (44) and light passing through the depression is 180°. In one embodiment, the depression (44) is formed in the substrate directly adjacent to an edge of the opaque feature (38). In another embodiment, the depression (58) surrounds a mesa structure (59) formed in the substrate (50), and the opaque feature (62) resides on the mesa structure (59). The depression (58) may be laterally spaced from an edge of the opaque feature (62).

20 Claims, 4 Drawing Sheets

US 7,018,747 B2

PHOTOMASK HAVING LINE END PHASE ANCHORS

BACKGROUND OF THE INVENTION

1. Field of the Invention

The present invention relates generally to semiconductor fabrication and, more particularly, to photomasks used during optical lithography and a method for fabricating the same.

2. Description of Related Art

The fabrication of an integrated circuit involves numerous processing steps. After impurity regions are formed within a semiconductor substrate and gate conductors/electrodes are defined upon the substrate, interconnect routing is placed across the substrate and connected to the impurity regions. An interlevel dielectric is formed between the interconnect routing and the substrate to isolate the two levels. Contact openings are formed through the dielectric and filled with a conductive material to electrically link the interconnect routing to select impurity regions in the substrate. Additional levels of interconnect routing separated by interlevel dielectric layers can be formed if desired. Different levels of the interconnect routing can be coupled together with ohmic contacts formed through the dielectric layers. Forming a multi-level integrated circuit in this manner reduces the overall lateral area occupied by the circuit.

Various features of the integrated circuit are typically defined using a technique known as optical lithography or photolithography. In optical lithography, a photosensitive film, i.e., photoresist, is spin-deposited across a substrate (e.g., a wafer) in which features are to be formed. An optical image is transferred to the photoresist by projecting a form of radiation, typically ultraviolet light, through the transparent portions of a photomask. A photochemical reaction alters the solubility of the regions of the photoresist exposed to the radiation. The photoresist is washed with a solvent known as a developer to preferentially remove the regions of higher solubility, followed by curing the remaining regions of the photoresist. The portions of the layer below the photoresist which are no longer covered by the photoresist are etched away to define features of the ensuing integrated circuit. The photoresist provides protection for the portions of the layer directly beneath the photoresist from being removed.

Unfortunately, as shown in FIGS. 1A and 1B, line end shortening is a phenomenon that often occurs during optical lithography. FIG. 1A depicts a maskplate or photomask having patterned rectangular opaque elements 10. The photomask is used to define a corresponding set of lines or features 12 on a semiconductor substrate, as shown in FIG. 1B. However, due to optical proximity effects, the lengths of features 12 are reduced in comparison to the lengths of the corresponding elements 10 on the maskplate (dashed lines 14 indicate the desired locations for the edges of features 12). This phenomenon is referred to as line end shortening. Such optical proximity effects can occur as a result of the diffraction of the radiation by small features. The scattering of the radiation adversely affects the resolution of the optical system such that the resulting photoresist features are skewed. The magnitude of these proximity effects is dependent upon the spacing between adjacent features. As such, optical proximity effects are particularly a problem during the fabrication of an isolated deep sub-micron feature of an integrated circuit.

Line end shortening can have a detrimental impact on the operation of the integrated circuit. As a result of line end shortening, the overlap of two structures, e.g., an active area to an overlying gate electrode, may be reduced, resulting in device leakage. Further, the overlapping area of a gate conductor to an overlying contact may be reduced, thereby undesirably causing an increase in contact resistance.

FIGS. 2A–2C illustrate the effect of line end shortening. FIG. 2A depicts a photomask used to pattern a feature of the semiconductor topography shown in FIG. 2B or 2c. The photomask shown in FIG. 2A includes a transparent substrate 16 upon which a non-transparent (opaque) patterned element 18 is formed. FIG. 2B depicts a semiconductor topography in which a metal contact 26 extends vertically through an interlevel dielectric 24 down to an impurity region 22 of a semiconductor substrate 20. A metal conductor 28 has been patterned on interlevel dielectric 24 and contact 26 using the photomask in FIG. 2A. Optical proximity effects have caused conductor 28 to be shorter in length than photomask feature 18 (indicated by dashed line 30). Consequently, the overlapping area between contact 26 and conductor 28 is significantly reduced, resulting in an increased contact resistance. FIG. 2c depicts another semiconductor topography in which an electrode 21 has been patterned on an active region 23 to form an active device known as a field-effect transistor (FET). The shortening of the extension of the electrode (indicated by dashed line 25) to the active area may cause electrical leakage in the device.

Line end shortening, therefore, may undesirably effect the operation of an integrated circuit. Accordingly, it would be desirable to provide a photomask suitable for patterning the features of an integrated circuit in accordance with their design specifications while simultaneously limiting line end shortening.

SUMMARY OF THE INVENTION

The present invention addresses these needs by providing a photomask and a method for fabricating a photomask having a depression formed in a transparent substrate adjacent to an opaque feature disposed on the substrate. Because the method requires no new materials and equipment, the fabrication method is readily implemented in photomask making facilities and the resulting photomask can be used in existing semiconductor fabrication processes. The depth of the depression is preselected to ensure that light passing through the substrate outside the depression and light passing through the depression is phase shifted 180°. The depression thus acts as an "anchor" at the end of the feature and effectively holds the edge of the feature in place when the photomask is used to pattern a layer of an integrated circuit via optical lithography. The presence of the depression reduces the pull back of a corresponding feature formed in the integrated circuit during the lithography process. As such, the feature formed in the integrated circuit more closely resembles its design specifications or drawn dimensions. The present invention thus improves the overlay of features in different layers of an integrated circuit.

According to the present invention, a substantially opaque feature is formed on a light transmissive substrate and a depression is etched in the substrate adjacent to the feature. A depression is herein defined as an area of the substrate sunken below adjacent areas of the substrate. The depression is etched to a depth such that a phase difference between light passing through transmissive areas of the substrate outside the depression and light passing through the depression is 180°.

According to one embodiment of the invention, the photomask is formed by first depositing an opaque material across a light transmissive substrate. A lithography technique is then used to pattern a first photoresist layer upon the opaque material such that a portion of the opaque material is exposed. This exposed portion of the opaque material is etched to define a substantially opaque feature on the substrate, followed by removing the first photoresist layer. Next, a second photoresist layer is patterned upon the feature such that the ends of selected features are exposed. The exposed feature ends are then etched, thereby shortening the length of the features and exposing corresponding areas of the substrate. Subsequently, the exposed areas of the substrate are etched to form a depression in the substrate adjacent to the feature ends. The depth of the depression is controlled such that light passing through the depression and light passing through transmissive portions of the substrate outside the depression is out of phase by 180°. The second photoresist layer is then removed to complete the photomask.

According to another embodiment of the invention, a photomask is formed by first depositing an opaque material across a light transmissive substrate. A first photoresist layer is patterned on the opaque material such that a portion of the opaque material is exposed, followed by etching the exposed portion of the opaque material to define a substantially opaque feature. After removing the first photoresist layer, the substrate is etched using the opaque feature as a mask to form a depression in the substrate. In this manner, a mesa structure at least partially surrounded by the depression is formed in the substrate. The opaque feature resides on the mesa structure. A second photoresist layer is subsequently patterned on the opaque feature such that an end of the feature is exposed. This exposed end of the opaque feature is etched such that the depression becomes laterally spaced from the edge of the opaque feature. Removal of the second photoresist layer completes the photomask. The depth of the depression or height of the mesa is controlled such that a phase difference between light passing through the substrate outside the depression (i.e., the mesa structure) and light passing through the depression is phase shifted by 180°.

The present invention also includes a method for forming an integrated circuit. This method comprises depositing a material on a semiconductor substrate, depositing photoresist across the material, patterning the photoresist using a photomask, and etching portions of the material exposed by the photoresist. The photomask comprises a depression formed in a light transmissive substrate adjacent to a substantially transparent feature patterned on the substrate. A phase difference between light passing through the substrate outside the depression and light passing through the depression is 180°. Other steps for forming the integrated circuit would be obvious to one skilled in the art.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE PREFERRED EMBODIMENTS

Reference will now be made in detail to the presently preferred embodiments of the invention, examples of which are illustrated in the accompanying drawings. It should be noted that the drawings are in simplified form and are not to precise scale. Although the disclosure herein refers to certain illustrated embodiments, it is to be understood that these embodiments are presented by way of example and not by way of limitation. The intent of the following detailed description is to cover all modifications, alternatives, and equivalents as may fall within the spirit and scope of the invention as defined by the appended claims.

It is to be understood and appreciated that the process steps and structures described herein do not cover a complete process flow for the manufacture of a photomask. The present invention may be practiced in conjunction with various integrated circuit fabrication techniques that are conventionally used in the art, and only so much of the commonly practiced process steps are included herein as are necessary to provide an understanding of the present invention.

Figure 1A:
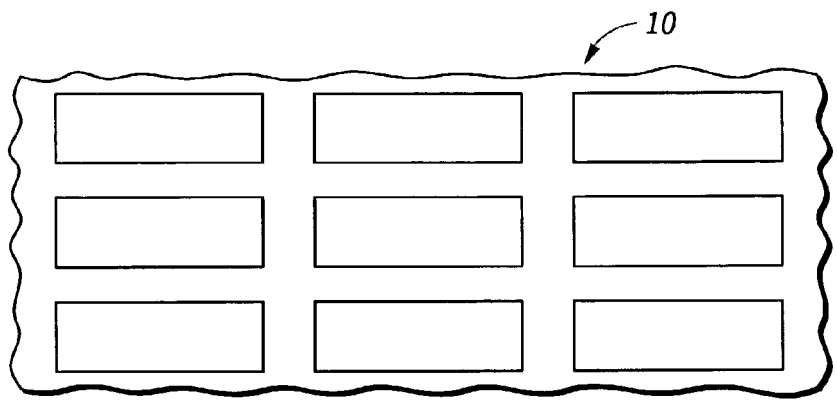
FIG. 1A is a top plan view of a conventional photomask having densely packed lines formed on a transparent substrate.
Figure 1B:
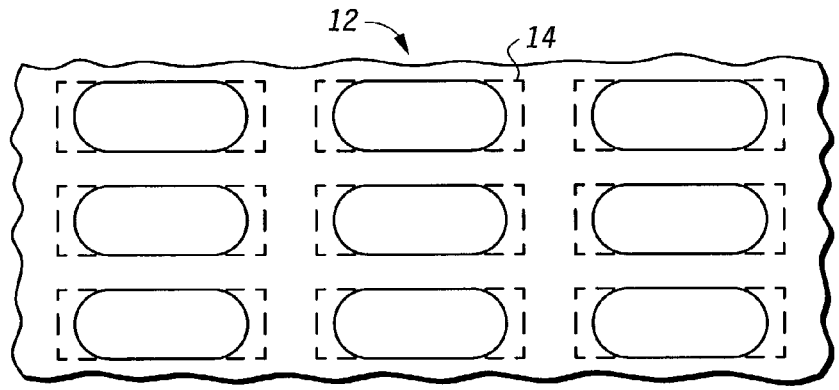
FIG. 1B is a top plan view of features formed by performing optical lithography using the conventional photomask depicted in FIG. 1A, wherein the features are shorter in length than desired as a result of the lithography process.
Figure 2A:
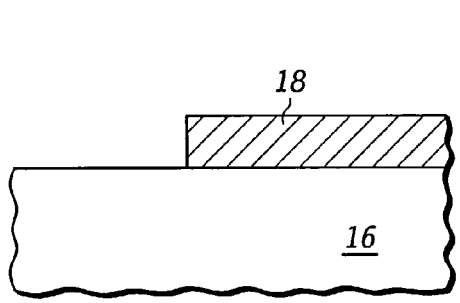
FIG. 2A is a cross-sectional view of a conventional photomask having a patterned line formed on a transparent substrate.
Figure 2B:
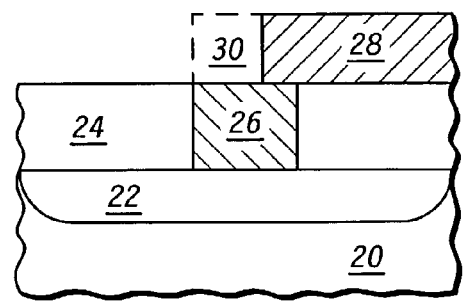
FIG. 2B is a cross-sectional view of a semiconductor topography in which a conductor has been patterned using the conventional photomask depicted in FIG. 2A, wherein the conductor is shorter in length than desired as a result of the lithography process.
Figure 2C:
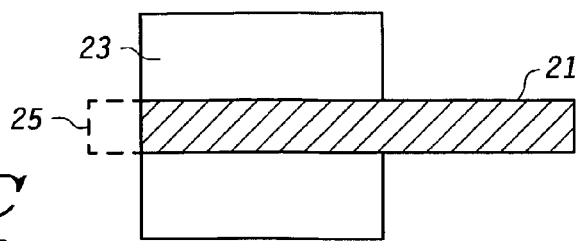
FIG. 2C is a top plan view of a semiconductor topography in which an electrode has been patterned using the conventional photomask depicted in FIG. 2A, wherein the end of the electrode is shortened as a result of the lithography process.
Figure 3:
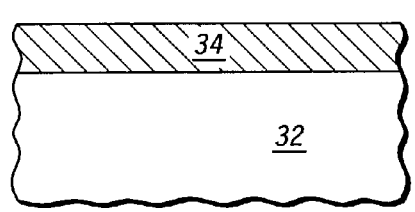
FIG. 3 is a cross-sectional view of a photomask being formed in accordance with a first embodiment of the present invention, wherein a substantially opaque material is deposited across a light transmissive substrate.
Figure 4:
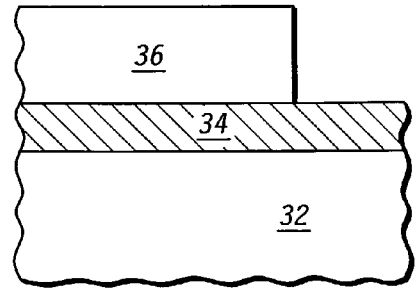
FIG. 4 is a cross-sectional view of the photomask depicted in FIG. 3, wherein a first photoresist layer is patterned upon the opaque material.
Figure 5:
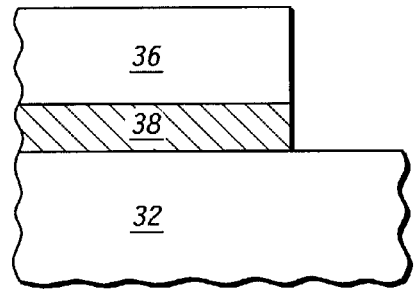
FIG. 5 is a cross-sectional view of the photomask depicted in FIG. 4, wherein an area of the opaque material exposed by the first photoresist layer is etched to define a substantially opaque feature upon the substrate.
Figure 6:
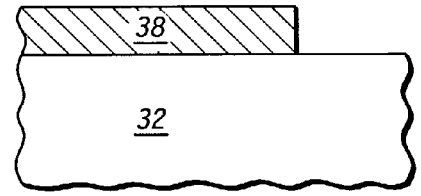
FIG. 6 is a cross-sectional view of the photomask depicted in FIG. 5, wherein the first photoresist layer is removed from the opaque feature.

Referring more particularly to the drawings, FIGS. 3–10 illustrate a method for forming a photomask in accordance with one embodiment of the invention. It is to be understood that only a small cross-section of the photomask is depicted in FIGS. 3–10. As shown in FIG. 3, a light transmissive substrate 32 is provided that preferably comprises quartz ($SiO_2$). A substantially opaque material 34 is formed across substrate 32 using, e.g., physical vapor deposition (PVD). Opaque material 34 may comprise a chromium-based material such as chromium, chromium oxide, chromium oxynitride, and combinations thereof. Subsequently, as shown in FIG. 4, a photoresist layer 36 is spin-deposited across opaque material 34 and patterned using a known lithography technique, e.g., electron beam lithography or optical lithography. As shown in FIG. 5, an area of opaque material 34 left exposed by patterned photoresist layer 36 is etched down to substrate 32 using, e.g., a dry etch technique that is highly selective to transmissive substrate 32. Photoresist layer 36 is sufficiently thick to protect an underlying area of opaque material 34 from being etched. An opaque feature 38 is thus defined on substrate 32 as a result of the etch process. As shown in FIG. 6, photoresist layer 36 is thereafter removed to expose opaque feature 38, which is typically in the shape of a line although it is to be understood that opaque feature 38 may be formed into any shape that is desired.

Figure 7:
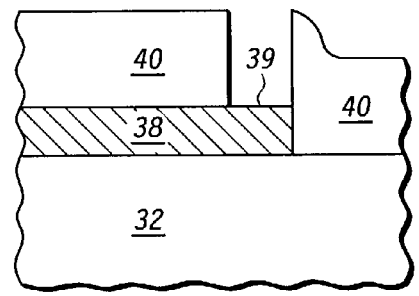
FIG. 7 is a cross-sectional view of the photomask depicted in FIG. 6, wherein a second photoresist layer is patterned on the opaque feature.
Figure 8:
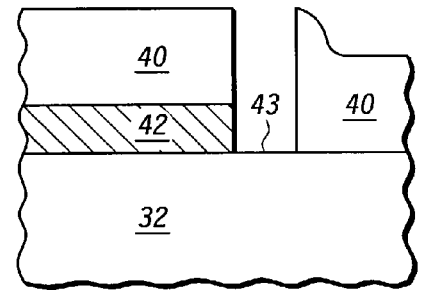
FIG. 8 is a cross-sectional view of the photomask depicted in FIG. 7, wherein an end of the opaque feature exposed by the second photoresist layer is etched to shorten the length of the opaque feature.
Figure 9:
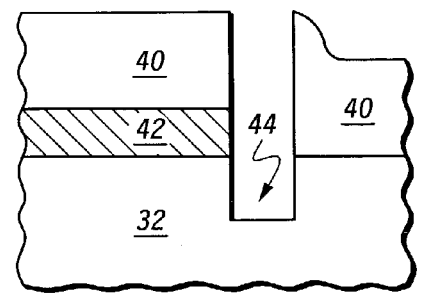
FIG. 9 is a cross-sectional view of the photomask depicted in FIG. 8, wherein an area of the substrate exposed by the removal of the end of the opaque feature is etched to form a depression directly adjacent to an edge of the opaque feature.

Turning to FIG. 7, another photoresist layer 40 is subsequently deposited across opaque feature 38 and patterned using a lithography technique such as electron beam lithography or optical lithography. Photoresist layer 40 is patterned to expose an end 39 of opaque feature 38. Exposed end 39 of opaque feature 38 is then etched down to substrate 32 using, e.g., a dry etch technique, to convert opaque feature 38 into the opaque feature 42 shown in FIG. 8, which has a shorter length than opaque feature 38, thereby exposing a portion 43 of substrate 32. Any suitable etch chemistry for removing the opaque material may be employed to remove exposed end 39 of opaque feature 38. Photoresist layer 40 protects underlying portions of the opaque feature and of substrate 32 from being removed during the etch process. As illustrated in FIG. 9, the portion 43 of substrate 32 left exposed by the removal of the end of the opaque feature is subsequently etched to form a depression 44 in substrate 32. Substrate 32 may be etched using, e.g., a dry, plasma etch in which any suitable etch chemistry for removing the substrate material is employed. The duration of the etch is selected to terminate after the depth of depression 44 has reached the point at which the phase difference between light passing through depression 44 and light passing through substrate 32 outside depression 44 is 180°. The phase difference is related to the depression depth by the following equation: $d=(\lambda/2)/(n-1)$; where d is the depth for the 180° phase, $\lambda$ is the wavelength of the light used in the optical lithography process to pattern the integrated circuit, and n is the refractive index of the transmissive substrate at this wavelength. For a quartz embodiment of substrate 32, the depth of depression 44 is therefore about 244 nanometers (nm) for a 248 nm radiation and 171 nm for a 193 nm radiation.

Figure 10:
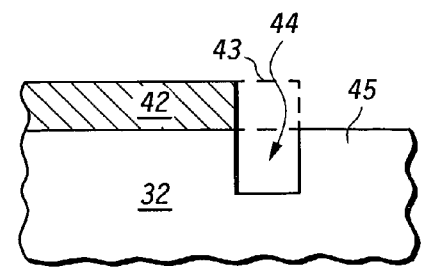
FIG. 10 is a cross-sectional view of the photomask depicted in FIG. 9, wherein the second photoresist layer is removed to complete the formation of the photomask.

As shown in FIG. 10, photoresist layer 40 may be removed to complete the formation of the photomask. Dashed line 43 indicates the original design layout of the opaque feature. Thus, the length of opaque feature 42 on the photomask in accordance with the present invention is shorter than that of the corresponding feature in the design layout. It is theorized that, due to diffraction effects, light passing through depression 44 will interfere destructively with light passing through a region 45 of the substrate 32 located outside depression 44. The peak interference will be at the phase edge and thus will not drift. Consequently, depression 44 acts as an anchor at the end of opaque feature 42 such that a corresponding end of a feature (e.g., a line) in an integrated circuit, which is formed using the photomask, is held near its original design location. That is, the photomask can be used to reduce the amount of line end shortening that occurs during the fabrication of an integrated circuit.

Figure 11:
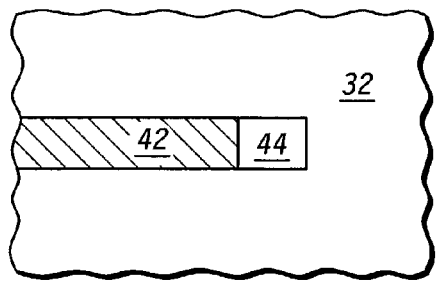
FIG. 11 is a top plan view of the photomask formed in FIG. 10.
Figure 12:
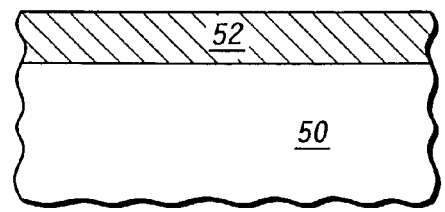
FIG. 12 is a cross-sectional view of a photomask being formed in accordance with a second embodiment of the present invention, wherein a substantially opaque material is deposited across a light transmissive substrate.
Figure 13:
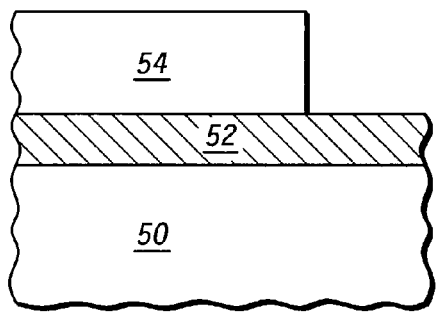
FIG. 13 is a cross-sectional view of the photomask depicted in FIG. 12, wherein a first photoresist layer is patterned upon the opaque material.
Figure 14:
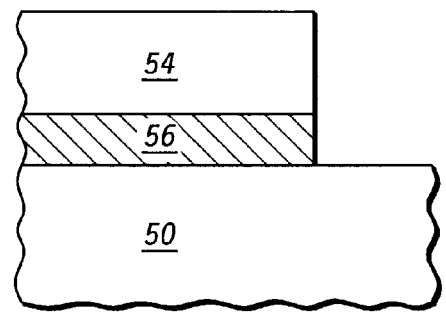
FIG. 14 is a cross-sectional view of the photomask depicted in FIG. 13, wherein an area of the opaque material exposed by the first photoresist layer is etched to define a substantially opaque feature upon the substrate.
Figure 15:
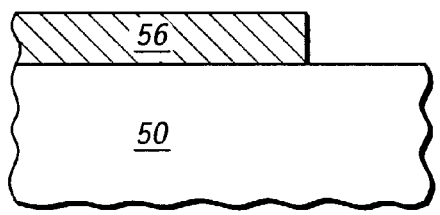
FIG. 15 is a cross-sectional view of the photomask depicted in FIG. 14, wherein the first photoresist layer is removed from the opaque feature.

FIG. 11 depicts a top plan view of the photomask shown in FIG. 10. Depression 44 is formed in transparent substrate 32 directly adjacent to an edge of opaque feature 42, which resides upon substrate 32. It is to be understood that FIG. 11 depicts only a portion of the photomask. Thus, the photomask may contain other features in addition to opaque feature 42 and depression 44.

FIGS. 12–19 illustrate a method for forming a photomask in accordance with another embodiment of the invention. FIGS. 12 through 15 and the processing steps associated therewith are substantially analogous to the processing steps of FIGS. 3 through 6 wherein reference numerals 50, 52, 54, and 56 of FIGS. 12 through 15 correspond to reference numerals 32, 34, 36, and 38 of FIGS. 3 through 5 respectively.

Figure 16:
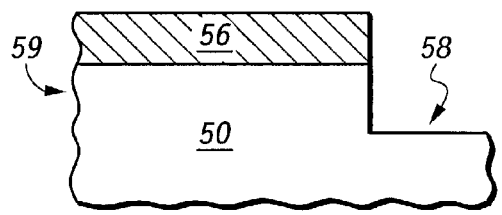
FIG. 16 is a cross-sectional view of the photomask depicted in FIG. 15, wherein a depression that is self-aligned to an edge of the opaque feature is etched in the substrate, thereby forming a mesa structure surrounded by the depression in the substrate.
Figure 17:
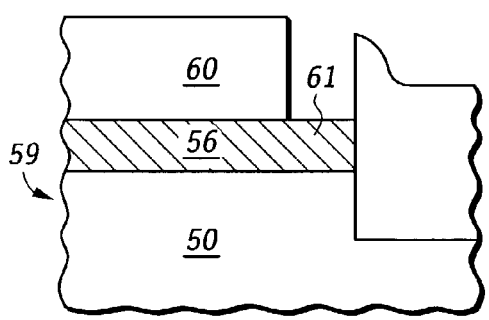
FIG. 17 is a cross-sectional view of the photomask depicted in FIG. 16, wherein a second photoresist layer is patterned on the opaque feature.
Figure 18:
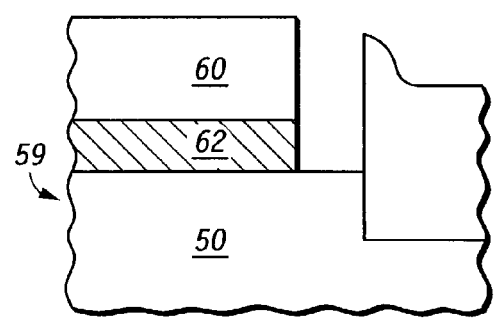
FIG. 18 is a cross-sectional view of the photomask depicted in FIG. 17, wherein an end area of the opaque feature exposed by the second photoresist layer is etched down to the substrate such that the edge of the opaque feature is laterally spaced from the depression.

Turning to FIG. 16, a depression 58 is etched in substrate 50 using opaque feature 56 as a mask such that depression 58 is self-aligned to the edge of feature 56. Substrate 50 may be etched using, e.g., a dry, plasma etch that is highly selective to the material of opaque feature 56. All areas of substrate 50 not covered by opaque feature 56 are therefore removed, forming a mesa structure 59 in substrate 50 having opaque feature 56 disposed thereon. Mesa structure 59 is preferably surrounded by depression 58. Subsequently, as shown in FIG. 17, a photoresist layer 60 is patterned upon opaque feature 56 and depression 58. Photoresist layer 60 leaves an end 61 of opaque feature 56 exposed. Exposed end 61 of opaque feature 56 is etched down to substrate 50 using, e.g., a dry etch technique, in which any suitable etch chemistry for removing the opaque feature is employed. As a result of the etch process, an opaque feature 62 having a shorter length is defined on substrate 50, as depicted in FIG. 18.

Figure 19:
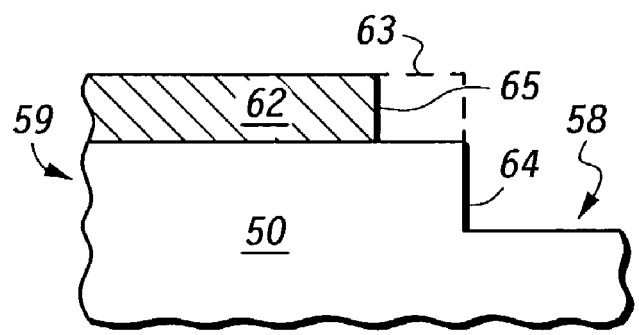
FIG. 19 is a cross-sectional view of the photomask depicted in FIG. 18, wherein the second photoresist layer is removed to complete the formation of the photomask.
Figure 20:
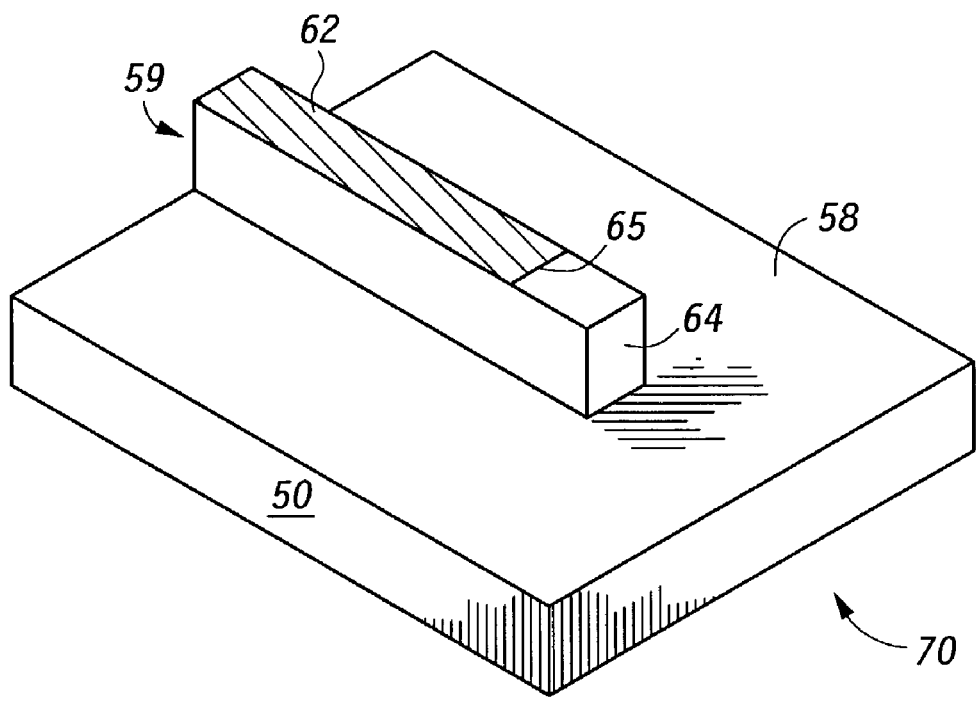
FIG. 20 is a perspective view of the photomask formed in FIG. 19.

Thereafter, as shown in FIG. 19 and FIG. 20, photoresist layer 60 is removed to form the photomask 70. The edge 65 of opaque feature 62 is spaced laterally from an edge 64 of mesa structure 59 depression 58. The depth of depression 58 is controlled wherein the phase difference between light passing through depression 58 and light passing through substrate 50 outside depression 58 (i.e., between opaque feature 62 and depression 58) is out of phase by 180°. The depth of depression 58 is therefore approximately 244 nm for the 248 nm light used to pattern the integrated circuit. Dashed line 63 indicates the original design layout of the opaque feature. Thus, the length of the opaque feature 62 of the photomask in accordance with the present invention is shorter than that of the corresponding feature in the design layout. Depression 58 acts as an anchor at the end of opaque feature 62 such that a corresponding end of a feature (e.g., a line) in an integrated circuit, which is formed using the photomask, is held near its original design location. The photomask can be used therefore to reduce the amount of line end shortening that occurs during the fabrication of an integrated circuit.

FIG. 20 depicts a perspective view of the photomask shown in FIG. 19. The photomask includes a mesa structure 59 formed in transparent substrate 50 and surrounded by depression 58. Opaque feature 62 is disposed on mesa structure 59 such that an edge of opaque feature 62 is laterally spaced from depression 58. It is to be understood that FIG. 20 may depict only a portion of the photomask. Thus, the photomask may contain other features in addition to opaque feature 62, mesa structure 59, and depression 58.

The photomask of the present invention can be used to fabricate an integrated circuit. In particular, the photomask can be used in the optical lithography process to pattern any layer of an integrated circuit. A layer of photoresist may be spin-deposited across the layer to be patterned, which is disposed upon a semiconductor wafer. The wafer is then placed into a patterning tool known as a "stepper" where it is aligned to the photomask and exposed to radiation, preferably ultraviolet (UV) radiation. The photomask may only be large enough to cover a small portion of the wafer, in which case the stepper steps the topography through many quadrants, each of them being exposed in turn until the entire or desired portion of the wafer has been exposed to UV light. The opaque feature of the photomask block the UV light such that UV light only passes through the transparent areas of the photomask. Depending upon whether positive or negative photoresist is used, the UV-exposed or non-UV-exposed portions of the photoresist become soluble in a developer solution. The wafer is then placed in a developer solution for dissolving the portions of the photoresist that are soluble, thereby yielding a patterned photoresist layer that may be used as a masking layer during a subsequent etch of the layer underlying the photoresist layer.

What is claimed is:

1. A photomask for forming an integrated circuit, comprising:
    a light transmissive substrate;
    an opaque feature covering a portion of the substrate, wherein the opaque feature has a length and a width wherein the length is greater than the width and wherein the opaque feature corresponds to a feature of the integrated circuit having a length and a width and further wherein the opaque feature length is less than the length of the corresponding integrated circuit feature; and
    a depression formed in a portion of the substrate not covered by the feature, but in proximity to an edge of the feature.

2. The photomask of claim 1, further wherein a depth of the depression produces a phase difference between light passing through the substrate outside the depression and light passing through the depression of 180°.

3. The photomask of claim 1, wherein the depression defines a mesa structure in the substrate wherein the mesa structure underlies the opaque feature and wherein a width of the mesa structure is substantially equal to a width of the opaque feature.

4. The photomask of claim 3, wherein an length of the opaque feature is the length of the mesa.

5. The photomask of claim 1, wherein the opaque feature comprises a chromium-based material and the substrate comprises quartz.

6. The photomask of claim 1, wherein the depression is positioned at an end of the opaque feature and wherein a width of the depression is substantially equal to a width of the opaque feature.

7. A method for forming a photomask, comprising:
    forming an opaque feature having a length and a width on a light transmissive substrate wherein the opaque feature corresponds to a feature of an integrated circuit to be formed using the photomask, and further wherein the length of the opaque feature is less than a length of the corresponding integrated circuit element; and
    etching a depression in at least a portion of the substrate not covered by the opaque feature, but in proximity to an edge of the opaque feature.

8. The method of claim 7, wherein forming the opaque feature comprises:
    depositing an opaque material across the substrate;
    patterning a first photoresist layer on the opaque material such that an area of the opaque material is exposed;
    etching the area of the opaque material exposed by the first photoresist layer to define the feature;
    removing the first photoresist layer;
    patterning a second photoresist layer on the feature such that an end of the feature is exposed; and
    etching the exposed end of the feature, thereby shortening a length of the feature and exposing an area of the substrate.

9. The method of claim 8, wherein etching the depression in the substrate comprises etching the area of the substrate exposed by the etching of the end of the feature, thereby forming the depression in the substrate directly adjacent to an edge of the feature.

10. The method of claim 7, wherein etching the depression comprises etching the entire portion of the substrate not covered by the opaque feature.

11. The method of claim 10, wherein the feature is used as a mask during the etching of the depression in the substrate such that the depression is self-aligned to an edge of the feature.

12. The method of claim 11, further comprising:
    patterning a second photoresist layer on the feature subsequent to the etching of the depression in the substrate, thereby exposing an end of the feature; and
    etching the end of the feature exposed by the second photoresist layer such that the depression is laterally spaced from the edge of the patterned feature.

13. The method of claim 7, wherein the feature comprises a chromium-based material and the substrate comprises quartz.

14. The method of claim 7, wherein the depression wherein the depression is positioned at an end of the opaque feature and wherein a width of the depression is substantially equal to a width of the opaque feature.

15. A photomask for fabricating an integrated circuit, comprising:
 a light transmissive substrate comprising a thick portion having a first thickness and a thinner portion having a second thickness; and
 an opaque feature formed on a portion of the thick portion of the substrate, an edge of the opaque feature being in proximity to the thinner portion of the substrate, wherein the opaque feature defines a line corresponding to a line in the integrated circuit and
 wherein a length of the opaque feature is shorter than a length of the corresponding integrated circuit line.

16. The photomask of claim 15, wherein the edge of the opaque feature is directly adjacent to the thin portion of the substrate.

17. The photomask of claim 15, wherein the edge of the opaque feature is laterally displaced from the thin portion wherein a portion of the thick portion of the substrate at an end of the opaque feature is not covered by the opaque feature.

18. The photomask of claim 15, wherein the thick portion of the substrate comprises the majority of the substrate and the thin portion of the substrate comprises portions of the substrate in proximity to an end of an opaque feature.

19. The photomask of claim 15, wherein the thin portion of the substrate comprises substantially all portions of the substrate not covered by the opaque feature.

20. The phototnaak of claim 15, wherein the thickness difference between the thin portion and the thick portion is approximately equal to $(\lambda/2)/(n-1)$ where $\lambda$ is the wavelength of light to which the photomask is exposed and n is the refractive index of the substrate.

* * * * *

UNITED STATES PATENT AND TRADEMARK OFFICE
CERTIFICATE OF CORRECTION

PATENT NO. : 7,018,747 B2  Page 1 of 1
APPLICATION NO. : 10/261905
DATED : October 1, 2002
INVENTOR(S) : Wei E. Wu It is certified that error appears in the above-identified patent and that said Letters Patent is hereby corrected as shown below:

In Column 10, Line 13, Claim No. 20:
    Change "The phototnaak of" to --The photomask of--

Signed and Sealed this

Thirteenth Day of May, 2008

JON W. DUDAS
*Director of the United States Patent and Trademark Office*

UNITED STATES PATENT AND TRADEMARK OFFICE
CERTIFICATE OF CORRECTION

PATENT NO. : 7,018,747 B2  Page 1 of 1
APPLICATION NO. : 10/261905
DATED : March 28, 2006
INVENTOR(S) : Wei E. Wu It is certified that error appears in the above-identified patent and that said Letters Patent is hereby corrected as shown below:

In Column 10, Line 13, Claim No. 20:
    Change "The phototnaak of" to --The photomask of--

This certificate supersedes the Certificate of Correction issued May 13, 2008.

Signed and Sealed this

Third Day of June, 2008

JON W. DUDAS
*Director of the United States Patent and Trademark Office*